(12) United States Patent
Kalifa et al.

(10) Patent No.: US 11,563,307 B2
(45) Date of Patent: Jan. 24, 2023

(54) HIGH SPEED HIGH BANDWIDTH VERTICAL-CAVITY SURFACE-EMITTING LASER

(71) Applicant: Mellanox Technologies, Ltd., Yokneam (IL)

(72) Inventors: Itshak Kalifa, Ramat Gan (IL); Elad Mentovich, Tel Aviv (IL)

(73) Assignee: Mellanox Technologies, Ltd., Yokneam (IL)

( * ) Notice: Subject to any disclaimer, the term of this patent is extended or adjusted under 35 U.S.C. 154(b) by 263 days.

(21) Appl. No.: 16/578,583

(22) Filed: Sep. 23, 2019

(65) Prior Publication Data
US 2020/0106242 A1    Apr. 2, 2020

Related U.S. Application Data

(60) Provisional application No. 62/739,594, filed on Oct. 1, 2018.

(51) Int. Cl.
*H01S 5/183* (2006.01)
*H01S 5/187* (2006.01)
(Continued)

(52) U.S. Cl.
CPC .......... *H01S 5/18361* (2013.01); *H01S 5/187* (2013.01); *H01S 5/3095* (2013.01); *H01S 5/3214* (2013.01); *H01S 5/227* (2013.01)

(58) Field of Classification Search
CPC .... H01S 5/18361; H01S 5/187; H01S 5/3214; H01S 5/3095; H01S 5/227;
(Continued)

(56) References Cited

U.S. PATENT DOCUMENTS 6,317,446 B1 * 11/2001 Wipiejewski ....... H01S 5/18313
372/96
6,594,294 B1 * 7/2003 Tsao .................... H01S 5/18341
372/99
(Continued)

OTHER PUBLICATIONS

Backer, A. et al.; "Transverse Optical Mode Analysis of Long-Wavelength VCSEL in High Single-Mode Operation"; Proc. of 8th Int. Conf. of Numerical Simulation of Optoelectronic Devices (NUSOD); pp. 87-88; 2008.
(Continued)

*Primary Examiner* — Xinning (Tom) Niu
(74) *Attorney, Agent, or Firm* — Alston & Bird LLP

(57) ABSTRACT

Example vertical cavity surface emitting lasers (VCSELs) include a mesa structure disposed on a substrate, the mesa structure including a first reflector, a second reflector defining at least one diameter, and an active cavity material structure disposed between the first and second reflectors; and a second contact layer disposed at least in part on top of the mesa structure and defining a physical emission aperture having a physical emission aperture diameter. The ratio of the physical emission aperture diameter to the at least one diameter is greater than or approximately 0.172 and/or the ratio of the physical emission aperture diameter to the at least one diameter is less than or approximately 0.36. An example VCSEL includes a substrate; a buffer layer disposed on a portion of the substrate; and an emission structure disposed on the buffer layer.

19 Claims, 5 Drawing Sheets

(51) Int. Cl.
*H01S 5/32* (2006.01)
*H01S 5/30* (2006.01)
*H01S 5/227* (2006.01)

(58) Field of Classification Search
CPC ........... H01S 5/34306; H01S 2301/176; H01S 5/18394; H01S 5/04256; H01S 5/0208; H01S 5/18333; H01S 5/18313; H01S 5/06226; H01S 5/04257; H01S 5/18308; H01S 5/18344
See application file for complete search history.

(56) References Cited

U.S. PATENT DOCUMENTS

| | | | |
|---|---|---|---|
| 2002/0101894 A1 | 8/2002 | Coldren et al. | |
| 2003/0020087 A1* | 1/2003 | Goto | C30B 29/403 372/46.01 |
| 2003/0161369 A1* | 8/2003 | Chang | H01S 5/343 372/45.01 |
| 2008/0137692 A1 | 6/2008 | Park et al. | |
| 2009/0155939 A1* | 6/2009 | Sung | H01S 5/0201 257/E21.238 |
| 2010/0189147 A1* | 7/2010 | Ji | H01S 5/18333 438/45 |
| 2011/0241564 A1* | 10/2011 | Shimizu | H01S 5/18347 372/45.01 |
| 2017/0373470 A1* | 12/2017 | Ledentsov | H01S 5/205 |

OTHER PUBLICATIONS

Caliman, A. et al.; "25 Gbps Direct Modulation and 10 km Data Transmission with 1310 nm Waveband Wafer Fused VCSELs"; Optics Express; vol. 24, No. 15; Jul. 25, 2016; pp. 16329-16335.
Feezell, D. et al.; "InP-Based 1.3-1.6 μm VCSELs With Selectively Etched Tunnel-Junction Apertures on a Wavelength Flexible Platform"; IEEE Photonics Technology Letters; vol. 17, No. 10; Oct. 2005; pp. 2017-2019.
Kapon, Eli et al.; "Power-Efficient Answer"; Nature Photonics; vol. 3; Jan. 2009; pp. 27-29.
Lin, Chao-Kun et al.; "High Temperature Continuous-Wave Operation of 1.3- and 1.55-μm VCSELs With InP/Air-Gap DBRs"; IEEE Journal of Selected Topics in Quantum Electronics; vol. 9, No. 5; Sep./Oct. 2003; pp. 1415-1421.
Sirbu, Alexei et al.; "Reliability of 1310 nm Wafer Fused VCSELs"; IEEE Photonics Technology Letters; vol. 25, No. 16; Aug. 15, 2013; pp. 1555-1558.
Sirbu, Alexei et al.; "Wafer-Fused Heterostructures: Application to Vertical Cavity Surface-Emitting Lasers Emitting in the 1310 nm Band"; Semiconductor Science and Technology; 26 (2011) 014016 (6pp); published Nov. 29, 2010.
Spiga, S. et al.; "Single-Mode 1.5μm VCSEL with 22-GHz Small-Signal Bandwidth"; Proceedings of the European VCSEL day-2016; Darmstadt; Jun. 3, 2016; 3 pages.
Spiga, S. et al.; "Single-Mode 1.5-μm VCSELs with Small-Signal Bandwidth Beyond 20 GHz"; ICTON-2016; paper Mo.D5.3; 2016; pp. 1-4.

\* cited by examiner

HIGH SPEED HIGH BANDWIDTH VERTICAL-CAVITY SURFACE-EMITTING LASER

CROSS-REFERENCE TO RELATED APPLICATIONS

This application claims priority to U.S. Application No. 62/739,594, filed Oct. 1, 2018, the content of which is hereby incorporated by reference in its entirety.

FIELD

Embodiments of the present invention relate generally to vertical-cavity surface-emitting laser (VCSEL). Example embodiments relate generally to high speed, high bandwidth VCSELs.

BACKGROUND

As data communication demands increase in both volume and speed, fiber optics have become an increasingly popular communication approach. One emerging element of this approach for generating the data stream communicated through fiber optics cables comprises a VCSEL optically coupled with a single mode fiber. However, traditional VCSEL designs tend to include too many parasitics (e.g., parasitic capacitance) for operating as a high speed, high bandwidth VCSEL. Additionally, preliminary attempts to manufacture high speed, high bandwidth VCSELs have failed to meet reliability constraints.

BRIEF SUMMARY OF SOME EXAMPLE EMBODIMENTS

Example embodiments of the present invention provide a high speed, high bandwidth VCSEL. For example, various embodiments provide VCSELs capable of communicating data at rates of 50 gigabytes per second or higher. In an example embodiment, the parasitics of the VCSEL are constrained. For example, in an example embodiment, the parasitics of the VCSEL are constrained by constraining the ratio of the VCSEL aperture diameter defined by the second reflector and/or the oxidation profile of the oxidation within the second reflector of the VCSEL and the physical emission aperture diameter defined by a first contact disposed on a cap layer and defining the emitting area of the VCSEL. In an example embodiment, a VCSEL using a semi-insulating GaAs or a Si substrate that has improved reliability is provided. For example, in an example embodiment, a buffer layer is provided between the substrate and the first reflector of the VCSEL. Thus, various example embodiments provide a high speed, high bandwidth VCSEL that satisfies reliability constraints.

According to a first aspect, a VCSEL is provided. In an example embodiment, the VCSEL comprises a mesa structure disposed on a substrate. The mesa structure comprises a first reflector, a second reflector defining at least one diameter, and an active cavity material structure disposed between the first and second reflectors. The VCSEL further comprises a second contact layer disposed at least in part on top of the mesa structure and defining a physical emission aperture having a physical emission aperture diameter. The ratio of the physical emission aperture diameter to the at least one diameter is greater than or approximately 0.172. The VCSEL defines an emission axis, and each of the at least one diameter and the physical emission aperture diameter is measured in a corresponding plane substantially perpendicular to the emission axis.

According to another aspect, a VCSEL is provided. In an example embodiment, the VCSEL comprises a mesa structure disposed on a substrate. The mesa structure comprises a first reflector, a second reflector defining at least one diameter, and an active cavity material structure disposed between the first and second reflectors. The VCSEL further comprises a second contact layer disposed at least in part on top of the mesa structure and defining a physical emission aperture having a physical emission aperture diameter. The ratio of the physical emission aperture diameter to the at least one diameter is less than or approximately 0.36. The VCSEL defines an emission axis, and each of the at least one diameter and the physical emission aperture diameter is measured in a plane perpendicular to the emission axis.

According to still another aspect, a VCSEL is provided. In an example embodiment, the VCSEL comprises a substrate; a buffer layer disposed on a portion of the substrate; and an emission structure disposed on the buffer layer.

BRIEF DESCRIPTION OF THE DRAWING(S)

Having thus described the invention in general terms, reference will now be made to the accompanying drawings, which are not necessarily drawn to scale, and wherein:

DETAILED DESCRIPTION OF SOME EXAMPLE EMBODIMENTS

The present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, terms such as "top," "bottom," "front," etc. are used for explanatory purposes in the examples provided below to describe the relative position of certain components or portions of components. Accordingly, as an example, the term "top current spreading layer" may be used to describe a current spreading layer; however, the current spreading layer may be on the top or on the bottom, depending on the orientation of the particular item being described. As used herein, the term "approximately" refers to tolerances within manufacturing and/or engineering standards.

Example VCSEL

Figure 1:
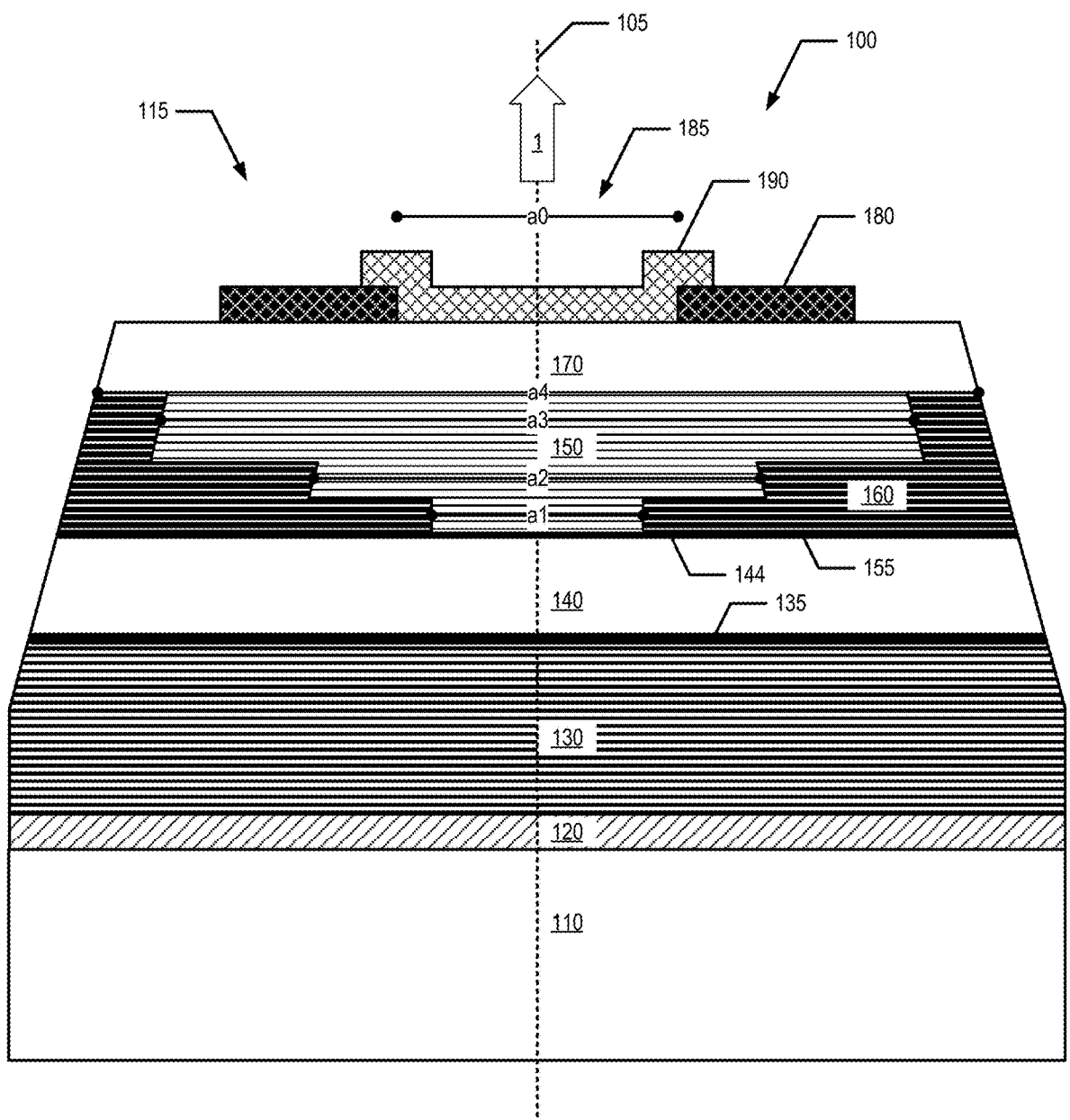
FIG. 1 illustrates a schematic cross-section of a VCSEL, according to an example embodiment.
Figure 2:
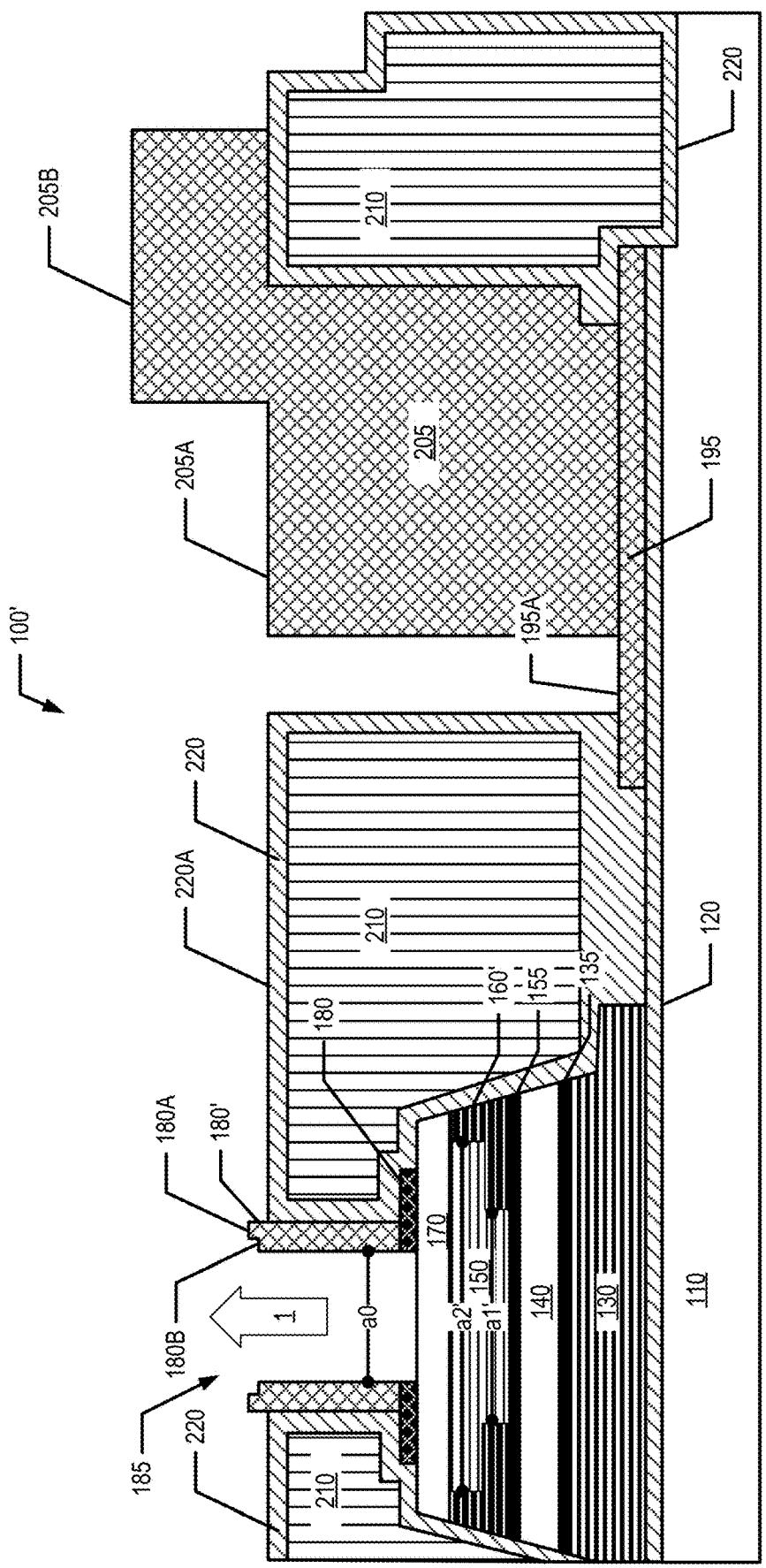
FIG. 2 illustrates a schematic cross-section of a VCSEL, according to another example embodiment.
Figure 3:
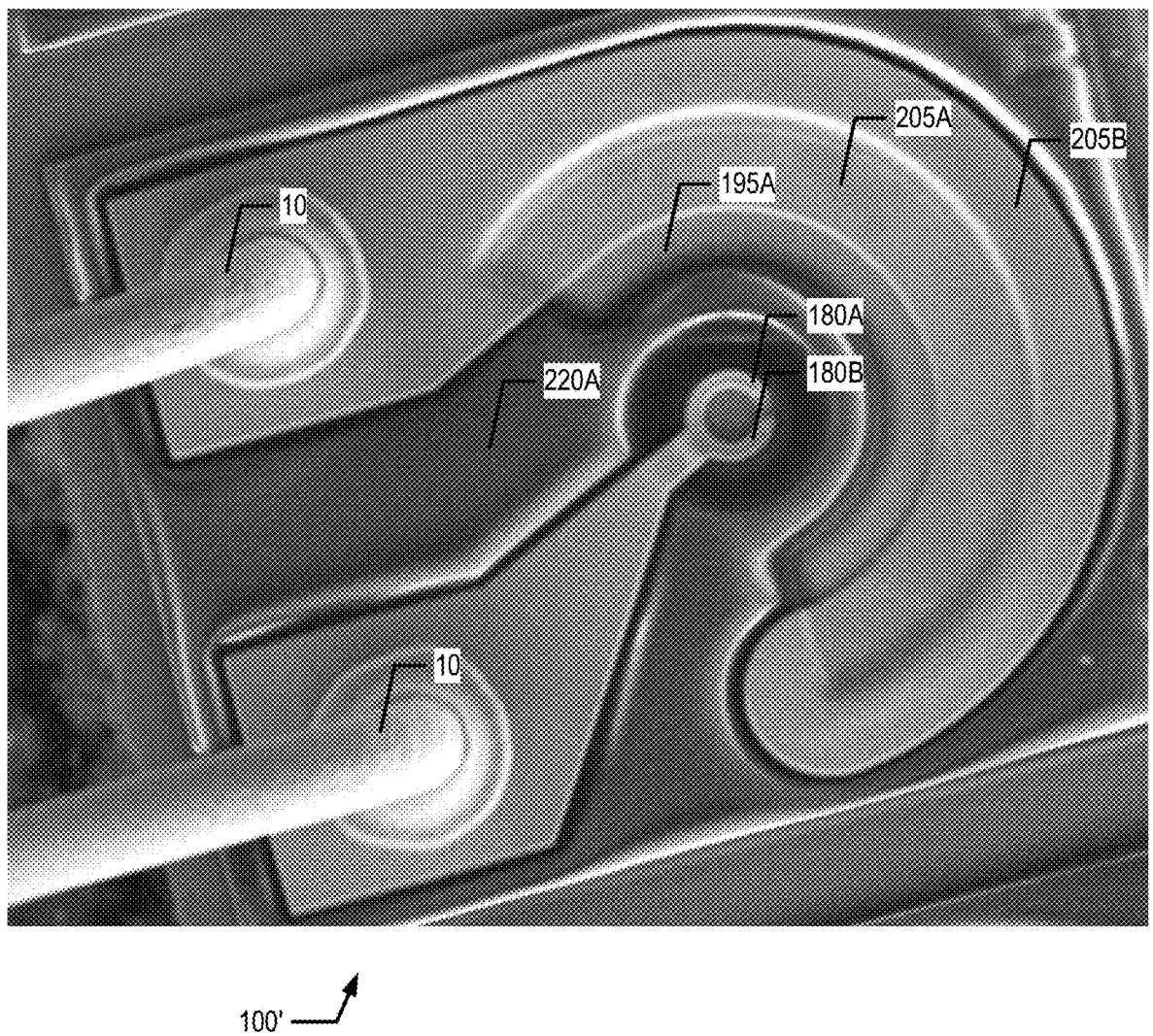
FIG. 3 illustrates a top view of the VCSEL shown in FIG. 2.
Figure 4:
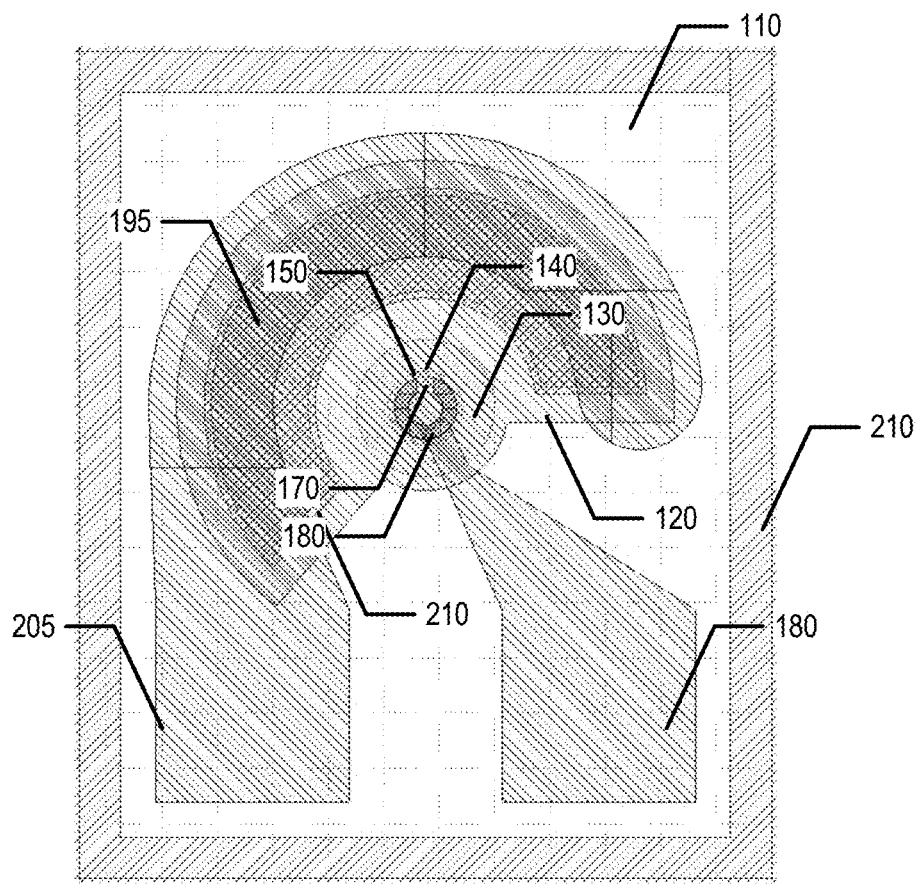
FIG. 4 illustrates a top cross-section view of a VCSEL, according to an example embodiment.
Figure 5:
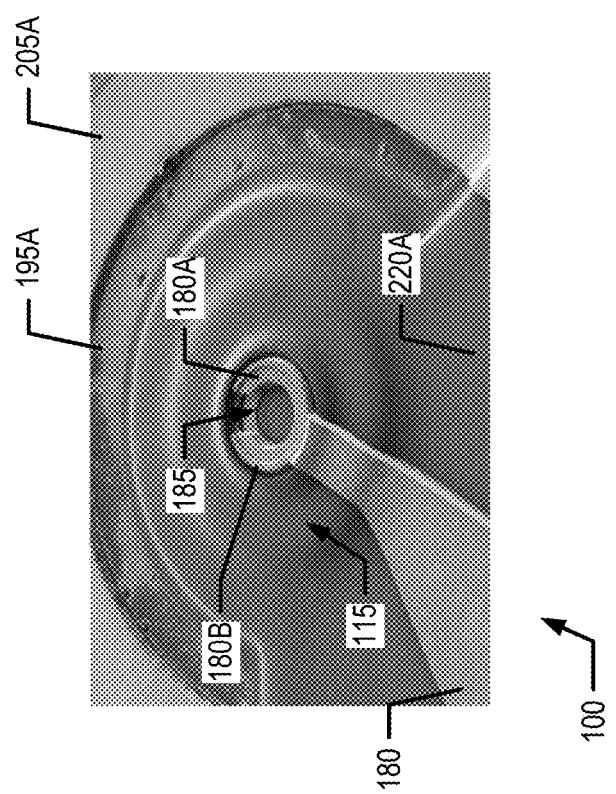
FIG. 5 illustrates a top view of a mesa structure of a VCSEL, according to an example embodiment.

FIGS. 1 and 2 illustrate cross section views of portions of example embodiments of vertical-cavity surface-emitting laser (VCSEL) 100, 100'. FIGS. 3 and 5 provide top views of an example embodiment of a VCSEL 100'. FIG. 4 provides a top cross-section view of a VCSEL 100. The VCSEL 100, 100' comprises a substrate 110, a buffer layer 120, an emission structure, and a cap layer 170. In an example embodiment, the emission structure comprises a first reflector 130, an active cavity material structure, and a second reflector 150. In an example embodiment, the emission structure forms and/or is part of a mesa structure 115. In an example embodiment, the active cavity material structure comprises a first current-spreading layer 135, an active region 140, and a second current-spreading layer 155. In an example embodiment, the active cavity material structure further comprises a tunnel junction over grown in the second current-spreading layer 155. In an example embodiment, the VCSEL 100, 100' further comprises a first contact 205 (e.g., comprising trace(s) and/or pad(s) for connecting an electrical source to the VCSEL 100, 100') that is electrically connected to the emission structure (e.g., the first current-spreading layer 135) via conductor 195. In an example embodiment, the VCSEL 100, 100' further comprises a second contact 180 disposed adjacent to, mounted to, secured to, and/or abutting the cap layer 170 and extending away from the emission structure to provide trace(s) and pad(s) for connecting an electrical source to the VCSEL 100, 100'. In an example embodiment, the second contact 180 is in electrical communication with the second current-spreading layer 155. In various embodiments, the first and second contacts 205, 180 are configured to have leads 10 secured thereto such that the VCSEL 100, 100' may be operated by applying voltage, current, an electrical signal and/or the like to the VCSEL 100, 100' via the leads 10. In an example embodiment, as shown in FIG. 2, the second contact 180' may comprise a stepped profile in the vicinity of the emission aperture 185 providing second contact surfaces 185A and 185B. Similarly, the first contact 205 may comprise a stepped profile in the vicinity of the mesa structure 115 providing first contact surfaces 205A and 205B. For example, the first contact 205 may be etched to remove material in the vicinity of the mesa structure 115 so as to reduce the parasitic capacitance of the VCSEL 100, 100'. Such etching may also lead to the exposure of conductive surface 195A and/or a dielectric disposed onto conductive surface 195A.

In an example embodiment, the second reflector 150 is partially oxidized and/or comprises one or more oxidized elements 160 that define an oxidation profile. In various embodiments, the oxidation profile defines one or more oxidation profile diameters (e.g., a1, a2, a3, a1', a2'). In various embodiments, the oxidation profile diameters (e.g., a1, a2, a3, a1', a2') are defined in planes that are perpendicular to the emission axis 105. In various embodiments, a second contact 180 may be disposed on the cap layer 170. In an example embodiment, the second contact 180 defines an aperture 185 through which the VCSEL 100, 100' may emit laser light 1. In various embodiments, an interior diameter of the second contact 180 defines a physical emission diameter a0 of the VCSEL 100, 100'. For example, the laser light 1 emitted by the VCSEL 100, 100' may be emitted along an emission axis 105 defined by the emission structure of the VCSEL 100, 100' and through an opening having a diameter a0 provided through the second contact 180. The diameter a0 is measured in a plane that is perpendicular to the emission axis 105.

In an example embodiment, the ratio of the physical emission diameter a0 to each of the oxidation profile diameters (e.g., a1, a2, a3, a1', a2') is greater than and/or approximately 0.172. For example, each of the ratios a0/a1, a0/a2, a0/a3, a0/a1', and a0/a2' may be greater than and/or approximately 0.172. In an example embodiment, the ratio of the physical emission diameter a0 to at least one of the oxidation profile diameters (e.g., a1, a2, a3, a1', a2') is less than and/or approximately 0.36. For example, the ratios a0/a3 and a0/a2' may be less than and/or approximately 0.36. In an example embodiment, the ratio of the physical emission diameter to a mesa diameter a4 is greater than and/or approximately 0.172 and/or less than and/or approximately 0.36, wherein the mesa diameter a4 is the diameter of the mesa at the top of the second reflector 150 and/or at another position along the second reflector 150 and/or active region 140. In various embodiments, these ratios of the physical emission diameter a0 to one or more of the oxidation profile diameters and/or the mesa diameter provide a uniform physical aperture target for ease of manufacturing while providing for reduced capacitance within the VCSEL 100, 100' to allow for high speed performance of the VCSEL 100, 100'. In various embodiments, these ratios of the physical emission diameter a0 to one or more of the oxidation profile diameters and/or the mesa diameter aids in reducing delamination of the cap layer 170 due to the large size of the aperture with respect to the size of the mesa structure 115.

In an example embodiment, the substrate 110 provides a base layer upon which the VCSEL is built, mounted, secured, and/or the like. In an example embodiment, the substrate 110 is a semi-insulating gallium arsenide (GaAs) substrate. In various embodiments, the substrate 110 is a GaAs substrate doped with silicon (Si) or various other elements. In an example embodiment, the substrate 110 is a Si substrate, or other appropriate substrate. In an example embodiment, the substrate 110 may be in the range of 50 to 300 µm thick. For example, the substrate 110 may be approximately 150 µm thick, in an example embodiment. In an example embodiment, the substrate 110 is at least a portion of a wafer.

In various embodiments, a buffer layer 120 provides an interface between the substrate 110 and the emission structure of the VCSEL 100. For example, a buffer layer 120 may cover at least a portion of the substrate 110 such that the emission structure of the VCSEL 100, 100' may be built on top of the buffer layer 120. In an example embodiment, the buffer layer 120 is grown on the substrate 110 or on a portion of the substrate 110. In an example embodiment, the buffer layer 120 is grown on all and/or most of the substrate 110 and is then removed after the first reflector 130 and/or other elements of the emission structure are grown thereon. For example, removal of the portion of the buffer layer 120 that is not disposed directly between the first reflector 130, first contact 205, and the second contact 180 and the substrate 110 reduces the buildup of capacitance between the first and second contacts 205, 180.

In an example embodiment, the buffer layer 120 is an n-type layer. In an example embodiment, the buffer layer 120 is an N+ GaAs layer. For example, the buffer layer 120 may be doped with sulfur, carbon, phosphorous, arsenic, antimony, bismuth, lithium, and/or other n-type dopant. In various embodiments, the buffer layer 120 may be doped with a concentration ($[Nd-Na]/cm^3$, where Nd is the number of donors (e.g., doping atoms) and Na is the number of acceptors (e.g., carrier atoms)) in the range of approximately $1 \times 10^{17}$ to $5 \times 10^{19}$ per cubic cm. For example, the buffer layer 120 may be a GaAs layer that is doped with a concentration ($[Nd-Na]/cm^3$) of approximately $4 \times 10^{18}$ per cubic cm, in an example embodiment. For example, the buffer layer 120 may be a GaAs layer that is doped to have a conductivity within the range of approximately 50 to 150 per ohm per cm. In an example embodiment, the buffer layer 120 is a GaAs layer that is doped to have a conductivity of approximately 90 per ohm per cm. In various embodiments, the buffer layer 120 is approximately 0.5 to 1.5 µm thick. For example, if the buffer layer 120 is approximately 0.5 to 1.5 µm thick the buffer layer does not provide any measureable effects on the thermal model of the VCSEL 100. In an example embodiment, the buffer layer is 1 µm thick.

In an example embodiment, the buffer layer 120 is only grown on, applied to, and/or retained at the portion of the substrate 110 upon which the emission structure of the VCSEL 100, 100' is to be grown, built, mounted, secured, and/or the like. In various embodiments, the buffer layer 120 ensures the VCSEL 100 will meet reliability constraints. For example, though changes may be made to the substrate 110 (e.g., doping concentration, and/or the like), the emission structure of the VCSEL 100 may not need to be updated due to the interface between the substrate 110 and the emission structure of the VCSEL provided by the buffer layer 120. For example, the buffer layer 120 may screen the VCSEL 100 from defects in the substrate 110, such as defect densities, and/or the like. For example, the buffer layer 120 may allow the VCSEL 100 to harness the advantages of the use of a semi-insulating substrate 110 and the reliability of the VCSEL emission structure designed for use with an n-type substrate. For example, the buffer layer 120 may permit higher connectivity of the layers of the first reflector 130 (e.g., an N-type distributed Bragg reflector (N-DBR)) grown and/or formed thereon leading to higher reflectivity for the first reflector 130. Additionally, the presence of the interface layer 120 may allow for the epitaxial growth of the first reflector 130 (e.g., an N-DBR) to begin and/or be started as if the first reflector 130 were being grown on an n+ substrate. Moreover, the buffer layer 120 may enable a well-controlled environment for separating between neighboring devices (e.g., neighboring VCSELs 100, 100' or other devices on the same substrate 110/wafer as the VCSEL 100, 100') and may reduce buildup of capacitance between neighboring devices (e.g., neighboring VCSELs 100, 100' or other devices on the same substrate 110/wafer as the VCSEL 100, 100') and/or between the contacts 180, 205 of the same device.

In an example embodiment, a cap layer 170 is deposited and/or disposed on the emission structure. The cap layer 170 may be an insulating layer made of $SiO_2$ or $Si_3N_4$, for example.

In various embodiments, the VCSEL 100, 100' comprises first and second contacts 205, 180. For example, the first contact 205 may be an anode contact and the second contact 180 may be a cathode contact, or vice versa. In an example embodiment, the first contact 205 is in electrical communication with a first current-spreading layer 135 and the second contact 180 is in electrical communication with a second current-spreading layer 155. In various embodiments, the first and/or second current-spreading layer 135, 155 comprises an indium gallium arsenide phosphide (In-GaAsP) layer. In various embodiments, the first and second current-spreading layers 135, 155 are configured to provide electrical signals, current, voltage, and/or the like applied to the first and second contacts 205, 180 to the active region 140. In various embodiments, the first and/or second contacts 205, 180 may be made of gold or another conductive material.

In various embodiments, the emission structure of the VCSEL 100, 100' comprises a first reflector 130, a first current-spreading layer 135, an active region 140, a second current-spreading layer 155, and a second reflector 150. The first reflector 130 may be adjacent, secured, mounted to and/or abutting the buffer layer 120. The first current-spreading layer 135 may be a current spreading and/or conductive layer sandwiched between the first reflector 130 and the active region 140. For example, the first current-spreading layer 135 may be adjacent, secured, mounted to and/or abutting the first reflector 130 and the active region 140. The second current-spreading layer 155 may be a current spreading and/or conductive layer sandwiched between the active region 140 and the second reflector 150. For example, the second current-spreading layer 155 may be adjacent, secured, mounted to and/or abutting the active region 140 and the second reflector 150.

In various embodiments, the first and second reflectors 130, 150 are configured to couple and/or reflect laser light generated by the active region 140 such that the laser light 1 may be emitted through the opening of diameter a0 in the second contact 180 in a direction along the emission axis 105. In various embodiments, each of the first and second reflectors 130, 150 comprises a semiconductor distributed Bragg reflector (DBR), dielectric reflector stacks, and/or the like. For example, the first and second reflectors 130, 150 may comprise un-doped alternating layers of aluminum gallium arsenide (AlGaAs) and gallium arsenide (GaAs). In various embodiments, each of the first and second reflectors 130, 150 may comprise a plurality of layers of AlGaAs and GaAs. For example, each of the first and second reflectors 130, 150 may comprise between 15 and 35 pairs of layers of GaAs/AlGaAs. For example, in an example embodiment, each of the first and second reflectors may comprise 25 pairs of layers of GaAs/AlGaAs. For example, each of the first and second reflectors may comprise 25 layers of GaAs and 25 layers of AlGaAs wherein the layers are disposed such that the layers alternate between a GaAs layer and an AlGaAs. For example, a pair of layers may consist of a GaAs layer and an abutting AlGaAs layer. In an example embodiment, the thickness of each layer is approximately one-fourth k/n, where λ, is emission wavelength and n is the refractive index of the semiconductor of that layer. In an example embodiment, at least one layer of the first reflector 130 is doped such that the first reflector comprises an n-type DBR (N-DBR). In an example embodiment, at least one layer of the second reflector 150 is doped such that the second reflector comprises a p-type DBR (P-DBR).

As described above, a first current-spreading layer 135 may be sandwiched between the first reflector 130 and the active region 140, and a second current-spreading layer 155 may be sandwiched between the active region 140 and the second reflector 150. In various embodiments, the first and second current-spreading layers 135, 155 comprise n-type indium phosphide (n-InP) layers. In various embodiments, providing the electrical contact through n-type first and second current-spreading layers 135, 155 allows for each of the first and second reflectors 135, 155 to comprise un-doped DBR mirrors or dielectric reflector stacks, as described elsewhere herein.

In various embodiments, the active region 140 comprises a tunnel junction that is embedded and/or disposed within the second current-spreading layer 155. For example, the tunnel junction may be overgrown by the second current spreading layer 155, wherein the tunnel junction is disposed adjacent the active region 140. In an example embodiment, the tunnel junction is a mesa etched in the $p^{++}/n^{++}$ tunnel junction. In an example embodiment, the tunnel junction comprises a heavily doped p++/n++ indium aluminum gallium arsenide tunnel junction. In various embodiments, a reverse biased p-n junction blocks the current around the tunnel junction when a direct voltage is applied to the VCSEL 100, 100' (e.g., via the first and second contacts 205, 180). In various embodiments, the tunnel junction serves a dual role of optical (photon) and electrical (current) confinement. The tunnel junction may, for example, be embedded in an overgrown region which provides both current and photon confinement. In this example, the current is confined by the reverse p-n junction that is formed at the interface between the second current-spreading layer 155 and a p-layer comprising a second surface 144 of the active region 140. In an example embodiment, optical confinement is defined by the tunnel junction representing an optical aperture for emitting laser light 1 and is determined by the width or diameter of the tunnel junction (e.g., the tunnel junction diameter $D_{TJ}$) in a plane perpendicular to the emission axis 105.

In various embodiments, the active region 140 is sandwiched and/or disposed between the first and second current-spreading layers 135, 155. In various embodiments, the active region 140 is in electrical communication with the first and second current-spreading layers 135, 155. In various embodiments, the active region 140 comprises a plurality of quantum wells, where light and/or electromagnetic radiation 1 is generated, between the first and second reflectors 130, 150. In various embodiments, the active region 140 may comprise a multi-quantum well (MQW) layer stack comprising a series of quantum wells disposed between a series of barriers, a p-type region (layer) disposed between the second current-spreading layer 155 and the MQW layer stack. For example, a second surface 144 of the active region 140 may comprise a p-type layer. In an example embodiment, the series of quantum wells and barriers may comprise six un-doped compressively strained, indium aluminum gallium arsenide (InAlGaAs) quantum wells and seven tensile strained InAlGaAs barriers.

In various embodiments, the VCSEL 100, 100' may comprise dielectric material 210. For example, the VCSEL 100, 100' may comprise dielectric material 210 configured to electrically isolate the first and second contacts 205, 180, the first and second current-spreading layers 135, 155, and/or the first and second reflectors 130, 150. In an example embodiment, the dielectric material comprises and/or consists of $Si_3N_4$. In another embodiment, the dielectric material comprises and/or consists of benzo-cyclo-butene (BCB). In various embodiments, the layer thickness of dielectric material 210 may be approximately 1 to 5 µm deep. The thickness of the dielectric material 210 may vary across the VCSEL 100, 100'. In various embodiments, an insulating layer 220 may be deposited and/or disposed on one or more surfaces of the dielectric material 210. In an example embodiment, the insulating layer 220 may comprise $SiO_2$, $Si_3N_4$, and/or the like.

CONCLUSION

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A vertical-cavity surface-emitting laser (VCSEL) comprising:
   a mesa structure disposed on a substrate, the mesa structure comprising:
      a first reflector,
      a second reflector defining at least one diameter, and
      an active cavity material structure disposed between the first and second reflectors, and
   a second contact layer disposed at least in part on top of the mesa structure and defining a physical emission aperture having a physical emission aperture diameter,
   wherein the VCSEL defines an emission axis, and each of the at least one diameter and the physical emission aperture diameter is measured in a respective corresponding plane substantially perpendicular to the emission axis, and
   wherein the VCSEL is configured to operate at a data rate of at least 50 gigabytes per second based on a constrained parasitic capacitance of the VCSEL corresponding to a ratio of the physical emission aperture diameter to the at least one diameter being in a range of 0.172 to 0.360.

2. The VCSEL of claim 1, wherein the second reflector comprises one or more oxidized elements defining an oxidation profile and the at least one diameter is an oxidation profile diameter defined by at least a portion of the oxidation profile.

3. The VCSEL of claim 1, wherein the at least one diameter is a mesa diameter.

4. The VCSEL of claim 1, wherein the active cavity material structure comprises:
   a first current-spreading layer,
   a second current-spreading layer,
   an active region disposed between the first current-spreading layer and the second current-spreading layer, and
   a tunnel junction overgrown by the second current spreading layer, wherein the tunnel junction is disposed adjacent the active region.

5. A vertical-cavity surface-emitting laser (VCSEL) comprising:
   a substrate;
   a buffer layer disposed on a portion of the substrate;
   an emission structure disposed on the buffer layer,
      wherein the emission structure comprises:
         a first reflector,
         a second reflector, and
         an active cavity material structure disposed between the first reflector and the second reflector; and
   a first contact and a second contact each in electrical communication with respective portions of the emission structure,
   wherein the first reflector is formed directly on the buffer layer and portions of the buffer layer not disposed between (a) the first reflector, the first contact, or the second contact and (b) the substrate have been removed.

6. The VCSEL of claim 5, wherein the buffer layer is an n-type layer.

7. The VCSEL of claim 5, wherein the thickness of the buffer layer is between approximately 0.5 µm and 1.5 µm.

8. The VCSEL of claim 5, wherein the substrate is one of an Si substrate or a doped GaAs substrate.

9. The VCSEL of claim 5, wherein the buffer layer is a GaAs layer.

10. The VCSEL of claim 5, wherein the active cavity material structure comprises:
   a first current-spreading layer,
   a second current-spreading layer,
   an active region disposed between the first current-spreading layer and the second current-spreading layer, and a tunnel junction overgrown by the second current spreading layer, wherein the tunnel junction is disposed adjacent the active region.

11. The VCSEL of claim 5, wherein the buffer layer is a GaAs layer doped with an n-type dopant.

12. The VCSEL of claim 11, wherein the buffer layer is doped with a concentration ($[Nd-Na]/cm^3$, where Nd is a number of doping atoms and Na is a number of GaAs atoms) in the range of approximately $1 \times 10^{17}$ to $5 \times 10^{19}$ per cubic cm.

13. The VCSEL of claim 11, wherein the buffer layer is doped to have a conductivity of approximately 50 to 150 per ohm per cm.

14. The VCSEL of claim 5, further comprising a first contact and a second contact, wherein a portion of the first contact and a portion of the second contact are disposed on the buffer layer.

15. The VCSEL of claim 5, further comprising a second contact layer disposed at least in part on top of the emission structure and defining a physical emission aperture having a physical emission aperture diameter, wherein the second reflector defines at least one diameter, wherein the VCSEL defines an emission axis, and each of the at least one diameter and the physical emission aperture diameter is measured in a respective corresponding plane substantially perpendicular to the emission axis, and wherein the VCSEL is configured to operate at a data rate of at least 50 gigabytes per second based on a constrained parasitic capacitance of the VCSEL corresponding to a ratio of the physical emission aperture diameter to the at least one diameter being in a range of 0.172 to 0.360.

16. The VCSEL of claim 1, further comprising a buffer layer disposed between the substrate and the first reflector, wherein the first reflector is in direct contact with the buffer layer.

17. The VCSEL of claim 16, wherein the buffer layer is an n-type layer.

18. The VCSEL of claim 16, wherein the substrate is one of an Si substrate or a doped GaAs substrate and the buffer layer is a GaAs layer.

19. The VCSEL of claim 16, wherein the buffer layer is disposed on only a portion of the substrate.

* * * * *